United States Patent
Einaga

(10) Patent No.: US 6,400,615 B2
(45) Date of Patent: *Jun. 4, 2002

(54) VOLTAGE RAISING CIRCUIT FOR SEMICONDUCTOR MEMORY

(75) Inventor: Yuichi Einaga, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/531,499

(22) Filed: Mar. 21, 2000

(30) Foreign Application Priority Data

Jul. 19, 1999 (JP) ............................................. 11-205290

(51) Int. Cl.[7] .................................................. G11C 7/00
(52) U.S. Cl. .............................. 365/189.11; 365/189.06; 365/211
(58) Field of Search ........................... 365/189.11, 211, 365/212, 226, 189.06; 327/538

(56) References Cited

U.S. PATENT DOCUMENTS

| 4,879,505 A | * 11/1989 | Barrow ........................ 327/538 |
| 5,367,489 A | * 11/1994 | Park ........................ 365/189.11 |
| 5,602,790 A | * 2/1997 | Mullarkey ................... 365/211 |
| 5,994,945 A | * 11/1999 | Wu .............................. 327/538 |

* cited by examiner

Primary Examiner—A. Zarabian
(74) Attorney, Agent, or Firm—Arent Fox Kintner Plotkin & Kahn, PLLC

(57) ABSTRACT

A voltage raising circuit of a semiconductor memory includes a compensating circuit. The compensating circuit has a negative dependency on a source voltage for controlling a variation of a raised voltage caused by a variation of the source voltage, and a positive dependency on temperature for controlling a variation of the raised voltage caused by a variation of the temperature.

4 Claims, 5 Drawing Sheets

VOLTAGE RAISING CIRCUIT FOR SEMICONDUCTOR MEMORY

BACKGROUND OF THE INVENTION

1. Field of the Invention

The present invention generally elates to semiconductor memories, and more particularly to a semiconductor memory in which a voltage raising circuit is capable of compensating a raised voltage for its variations caused by a source voltage and temperature.

2. Description of the Related Art

FIG. 1 shows a conventional flash memory. As shown in this diagram, the flash memory comprises a cell array 101, a reference cell 102, a sense amplifier 103, a control circuit 104, a voltage raising circuit 105, switches 102 through 123, and MOS (metal oxide semiconductor) transistors 124 through 126.

Also, the cell array 101 consists of a plurality of memory cells 110 through 113 for storing data "1" or "0".

By way of example, a description is given below with respect to how the data is read out of the memory cell 110 of the cell array 101 of the flash memory.

The control circuit 104 sends a voltage raising signal KICKB to the voltage raising circuit 105. When the voltage raising circuit 105 receives the KICKB signal, it raises and outputs a voltage to a node "a".

Also, in order to select a word line WL0, the control circuit 104 outputs a word-line selecting signal WSEL0 to turn on the switch 120. Thus, the voltage raised by the voltage raising circuit is applied to the word line WL0.

Also, in order to select a bit line B0, the control circuit 104 outputs a bit-line selecting signal BSEL0 to turn on the MOS transistor 124.

Also, in order to select a reference cell, the control circuit 104 simultaneously outputs two selecting signals WSEL and BSEL to turn on the switch 123 and the MOS transistor 126, respectively. Thus, an electric current flowing through the memory cell 110 and an electric current flowing through the reference cell 102 are inputted into the sense amplifier 103, where the two electric currents are compared.

If the electric current flowing through the memory cell 110 is larger than the electric current flowing through the reference cell 102, then "1" is outputted from an output D of the sense amplifier 103, whereas if smaller, then "0" is outputted from the output D thereof. The date "1" or "0" is thus read out of the memory cell 110.

Similarly, the date "1" or "0" can be read out of the other memory cells 111, 112 and 113 as the previously described.

FIG. 2 is a graph showing various relationships between gate voltages Vg and drain currents Id with respect to the memory cells 110 through 113 of the cell array 101 and the reference cell 102.

As can be seen from FIG. 2, a solid line 201 shows a relationship between the gate voltages Vg and the drain currents Id in a case where "1" is stored in the memory cells 110 through 113 of the cell array 101. A solid line 202 shows a relationship between the gate voltages Vg and the drain currents Id in a case where "1" is stored in the memory cells 110 through 113 of the cell array 101. A solid line 203 shows a relationship between the gate voltage Vg and the drain current Id of the reference cell 102.

Also, a broken line 204 shows a case where a source voltage VCC is applied to gates of the memory cells 110 through 113 of the cell array 101 and the reference cell 102.

In this case, if the data "1" is stored in the memory cells 110 through 113 of the cell array 101, then the stored data "1" can be identified by the sense amplifier 103 because a drain current of the memory cells 110 through 113 is larger than that of the reference cell 102, whereas if the data "0" is stored therein, then the data "0" cannot be identified by the sense amplifier 103 because both of the drain currents are too small.

For this reason, in the case of reading the data "1" or "0" out of the memory cells 110 through 113, the voltage applied to the gates of memory cells 110 through 113 and the reference 102 should be raised to a voltage shown by a broken line 205.

Further, when the raised voltage 205 is lowered to a voltage shown by a broken line 206 due to variations of the source voltage VCC and temperature, as previously described, the data "0" cannot be read out of the memory cells 110 through 113 of the cell array 101. On the other hand, when the voltage 205 is raised to a voltage shown by a broken line 207 due to variations of the source voltage VCC and temperature, the data "0" may be written into the memory cells 110 through 113 of the cell array 101.

FIG. 3 shows a conventional voltage raising circuit 105.

As shown in this diagram, the conventional voltage raising circuit 105 comprises a PMOS transistor tr1, nMOS transistors tr2, tr3 and tr15, inverters 301 through 303, capacitors Ca and Cb, and a clamp circuit 310.

The clamp circuit 310 consists of a pMOS transistor tr4, nMOS transistors tr5 and tr6, and inverters 304 and 305.

Also, FIG. 4 shows operation timing of the conventional voltage raising circuit 105.

Referring to FIGS. 3 and 4, when the KICKB signal is changed from a high level to a low level, the pMOS transistor tr1 turns ON and a level of the KICK0 signal become high. At the same time, the nMOS transistor tr3 and the nMOS transistor tr15 turn OFF and the node bb4 becomes floating. A voltage applied to the node bb4 is raised higher than the source voltage VCC due to coupling by capacitance between a drain and a gate of the nMOS transistor tr2, and thereby the nMOS transistor tr2 turns ON so as to charge the capacitors Ca and Cb rapidly.

While the KICK0 is at the high level, on the other hand, the pMOS transistor 4 and the nMOS transistors tr5 and tr6 turn ON after two stage delay of inverter 304 and the inverter 305. Thereby, the clamp circuit 310 is actuated to apply a predetermined voltage thereof to the node bb4 and control an electric current flowing through the nMOS transistor tr2. Thus, a voltage applied to the node bb3 is controlled to a voltage that is just Vth, a threshold value of the nMOS transistor tr2, lower than the voltage applied to the node bb4. That is, the voltage applied to the node bb3 is (bb4−Vth) as shown in FIG. 4.

A raised voltage Va applied to the node "a" can be obtained by taking the form $$Va = VCC + [Ca/(Ca+Cb)] \times bb3$$

where VCC denotes the source voltage, Ca denotes capacitance for raising a voltage, Cb denotes parasitical capacitance of the node "a", and bb3 denotes the voltage applied to the node bb3.

When the KICKB is changed from the low level to the high level, the node bb3 becomes a ground level.

It should be noted that it takes several nano-seconds to raise the voltage applied to the node bb3 to the predetermined voltage while the KICKB signal is kept at the low level, and thereafter it takes several tens of nano-seconds to make the KICKB signal be high again.

Table 1 shows a dependency of the conventional voltage raising circuit of FIG. 3 on the source voltage VCC.

TABLE 1

| Source voltage VCC (V) | 2.6 | 3.0 | 3.7 |
|---|---|---|---|
| Voltage of Node "a" Va (V) | 4.11 | 4.59 | 5.43 |
| Voltage of node bb3 (V) | 2.36 | 2.48 | 2.76 |

As can be understood from the Table 1, when the source voltage VCC is raised from 2.6 V to 3.7 V, the voltage Va applied to the node "a" is raised by 1.32 V from 4.11 V to 5.43 V. Accordingly, the voltage Va applied to the node "a" has the positive dependency on the source voltage VCC.

Further, Table 2 shows a dependency of the conventional voltage raising circuit of FIG. 3 on the temperature.

TABLE 2

| Temperature (° C.) | −55 | 25 | 140 |
|---|---|---|---|
| Voltage of Node "a" Va (V) | 4.65 | 4.59 | 4.48 |
| Voltage of node bb3 (V) | 2.56 | 2.48 | 2.31 |

As can be understood from the Table 2, when the temperature is raised from −55° C. to 140° C., the voltage Va applied to the node "a" is lowered by 0.17 V from 4.65 V to 4.48 V. This is because the higher the temperature is, the slower it is that the voltage applied to the node bb3 is controlled to a voltage determined by the clamp circuit 310 in a given time. Accordingly, the voltage Va applied to the node "a" has the negative dependency on the temperature.

Thus, the higher the source voltage VCC and the lower the temperature become, the higher voltage Va applied to the node "a" becomes, to the contrary the lower the source voltage VCC and the higher the temperature become, the lower voltage Va applied to the node "a" becomes.

As a result, the conventional voltage raising circuit of FIG. 3 brings about such a problem that in the case where the source voltage VCC is low and the temperature is high, the data "0" may not be read out of the memory cells 110 through 113 of the cell array 101, whereas in the case where the source voltage VCC is high and the temperature is low, the data "0" may be written into the memory cells 110 through 113 of the cell array 101.

SUMMARY OF THE INVENTION

It is a general object of the present invention to provide a voltage raising circuit of a semiconductor memory, in which the above problem can be eliminated.

Another and a more specific object of the present invention is to provide a voltage raising circuit of a semiconductor memory, said voltage raising circuit comprising:

a compensating circuit having a negative dependency on a source voltage for controlling a variation of a raised voltage, said variation being caused by a variation of said source voltage.

Still another object of the present invention is to provide a voltage raising circuit of a semiconductor memory, said voltage raising circuit comprising:

a compensating circuit having a positive dependency on temperature for controlling a variation of a raised voltage, said variation being caused by a variation of said temperature.

Still another object of the present invention is to provide a voltage raising circuit of a semiconductor memory, said voltage raising circuit comprising:

a compensating circuit having:
  a negative dependency on a source voltage for controlling a first variation of a raised voltage, said first variation being caused by a variation of said source voltage; and
  a positive dependency on temperature for controlling a second variation of said raised voltage, said second variation being caused by a variation of said temperature.

Other objects, features and advantages of the present invention will become more apparent from the following detailed description when read in conjunction with the accompanying drawings.

DETAILED DESCRIPTION OF THE PREFERRED EMBODIMENT

With reference to the drawings, a description will be given below of a preferred embodiment of the present invention.

Figure 5:
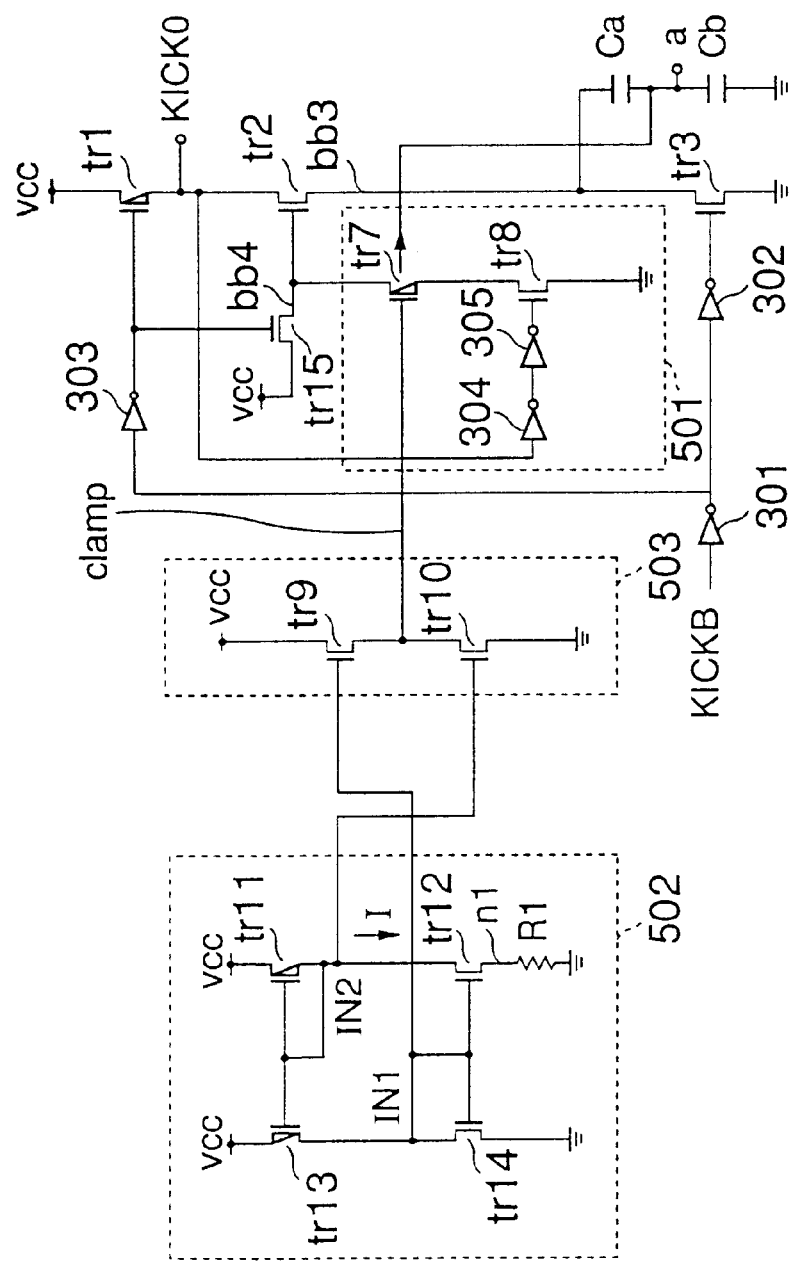
FIG. 5 is a schematic view showing a voltage raising circuit of the present invention.

FIG. 5 is a schematic diagram for illustrating a voltage raising circuit of the preferred embodiment of the present invention. In this diagram, parts, which are the same as those shown in FIG. 3, are given the same reference numerals.

Figure 1:
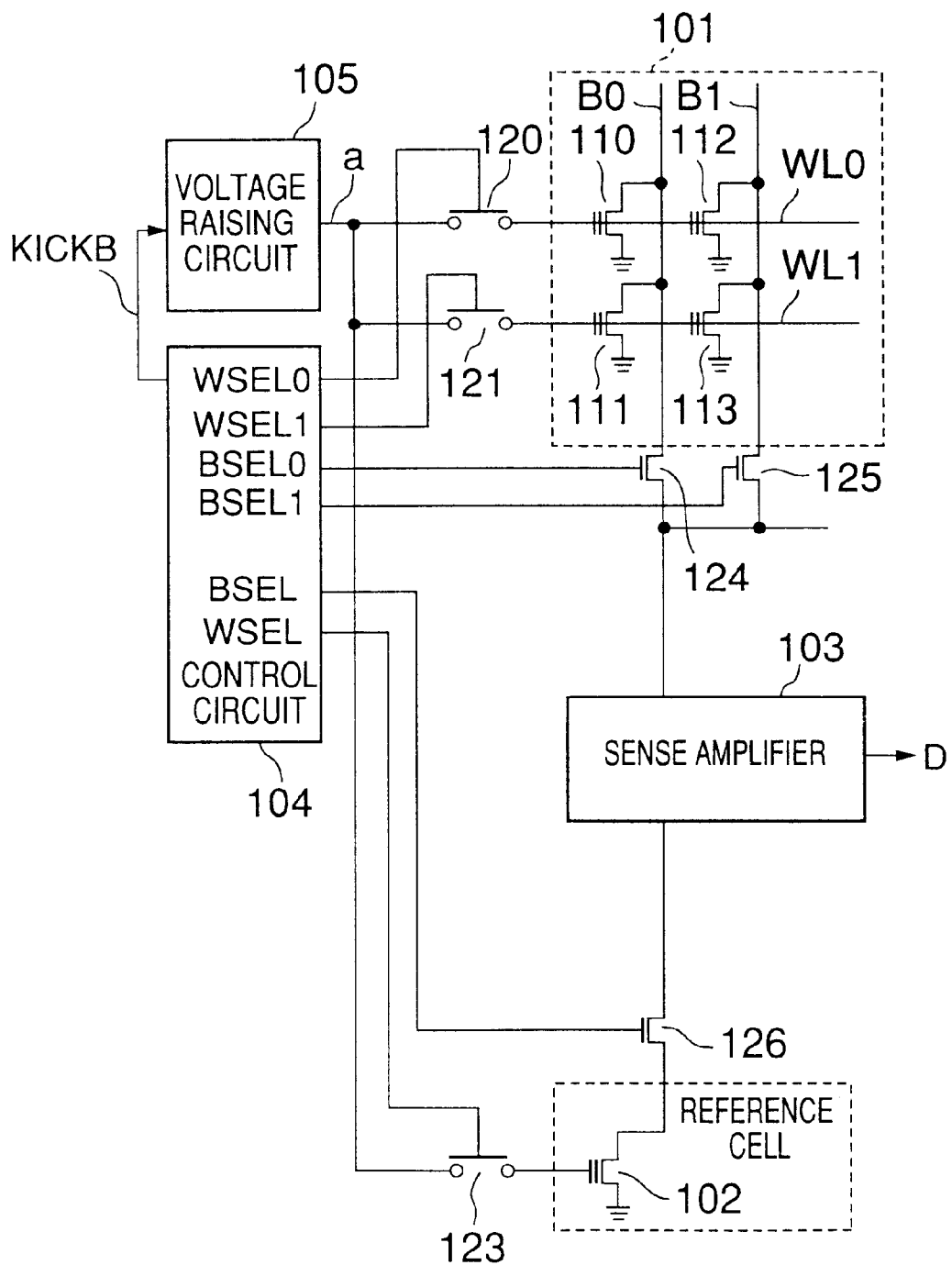
FIG. 1 is a schematic view showing a conventional flash memory.
Figure 2:
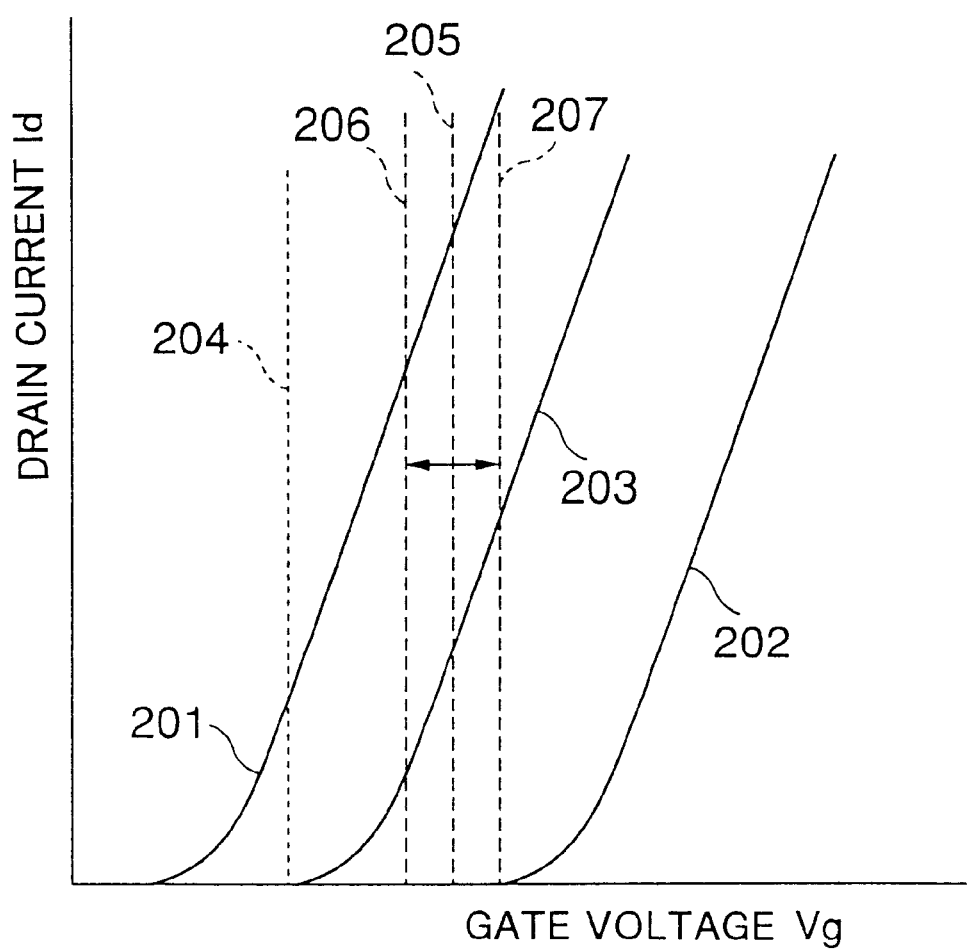
FIG. 2 is a graph illustrating various relationships between gate voltages and drain currents of memory cells of a cell array and a reference cell.
Figure 3:
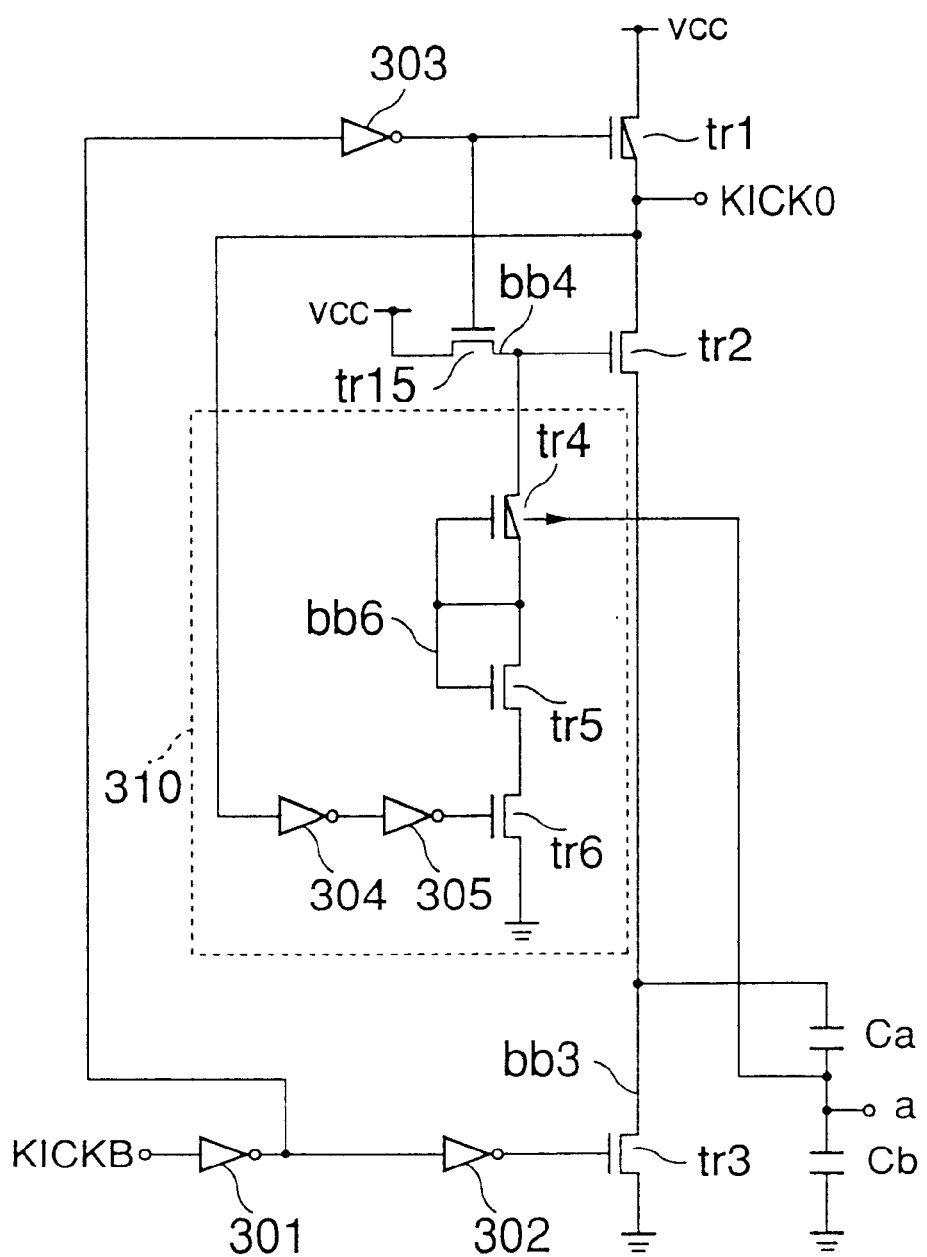
FIG. 3 is a circuit diagram showing a conventional voltage raising circuit.
Figure 4:
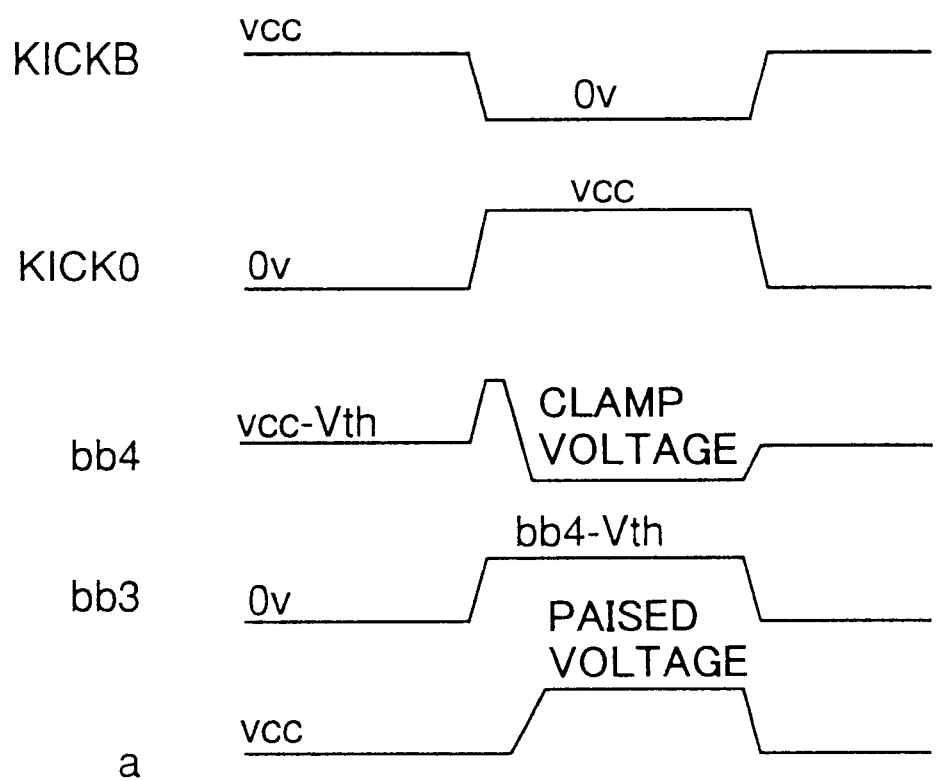
FIG. 4 is an operation timing diagram of the conventional voltage raising circuit.

Unlike the conventional voltage raising circuit of FIG. 3, the voltage raising circuit of the preferred embodiment of the present invention comprises an improved clamp circuit 501, and two compensating circuits 502 and 503 which serve to compensate the source voltage VCC and the temperature.

As shown in FIG. 5, the compensating circuit 502 includes pMOS transistors tr11 and tr13, nMOS transistors tr12 and tr14, and a resistance R1. The compensating circuit 503, on the other hand, includes nMOS transistors tr9 and tri0. It should be noted that the nMOS transistors tr9 and tri0 each have a threshold value Vth lower than the other nMOS transistors do.

Further, the voltage raising circuit of the present invention comprises a node "Clamp", which corresponds to a node bb6 within the clamp circuit 310 serving to control the node bb4 of FIG. 3. The node "Clamp" is controlled by the two compensating circuits 502 and 503 such that the node "Clamp" is given the negative dependency on the source voltage VCC and the positive dependency on the temperature so as to compensate the variations of the voltage Va.

First, a description is given below with respect to compensation for variations of the source voltage VCC.

In the conventional voltage raising circuit shown in FIG. 3, the voltage applied to the node bb3 has the positive dependency on the source voltage VCC. In contrast, in the voltage raising circuit of the present invention shown in FIG. 5, the node "Clamp" gives the node bb3 the negative dependency on the source voltage VCC.

The compensating circuit 502 is a constant voltage circuit, where a node IN1 serving as a first output always outputs a constant voltage regardless of the source voltage VCC, whereas a node IN2 serving as a second output outputs a variable voltage that is raised with a raise of the source voltage VCC.

The node IN1 is coupled to a gate of the nMOS transistor tr9 of the compensating circuit 503. The output IN2 is coupled to a gate of the nMOS transistor tr10 of the compensating circuit 503. Thereby, a voltage applied to the gate of the nMOS transistor tr9 is constant regardless of the source voltage VCC and a voltage applied to the output IN2 is raised with the raise of the source voltage VCC. As a result, a voltage applied to the node "Clamp" is lowered with the raise of the source voltage VCC. Thus, the voltage applied to the node "Clamp" has the negative dependency on the source voltage VCC. On the other hand, a voltage applied to the node bb4 is just Vth, a threshold value of the pMOS transistor tr7, higher than the voltage applied to the node "Clamp", and therefore the voltage applied to the node bb4 has the negative dependency on the source voltage VCC as well. Since a voltage applied to the node bb3 is just Vth, a threshold value of the nMOS transistor tr2, lower than that applied to the node "Clamp", the node bb3 is compensated for its positive dependency on the source voltage VCC. As a result, the voltage Va applied to the node "a" is thus compensated for its positive dependency on the source voltage VCC.

Table 3 shows the dependency of the voltage raising circuit of the present invention on the source voltage VCC.

TABLE 3

| Source voltage VCC (V) | 2.6 | 3.0 | 3.7 |
|---|---|---|---|
| Voltage of Node "a" Va (V) | 4.15 | 4.46 | 4.99 |
| Voltage of node bb3 (V) | 2.60 | 2.48 | 2.24 |
| Voltage of node "Clamp" (V) | 1.42 | 0.900 | 0.325 |

Referring back to in the Table 1, in the conventional voltage raising circuit of FIG. 3, when the source voltage VCC is raised from 2.6 V to 3.7 V, the voltage Va applied to the node "a" is raised by 1.32 V from 4.11 V to 5.43 V. In the voltage raising circuit of the present invention, however, as can be understood from the Table 3, when the source voltage VCC is raised by 1.1 V from 2.6 V to 3.7 V, the voltage Va applied to the node "a" is raised by 0.84 V from 4.15 V to 4.99 V. Accordingly, the raise of the voltage Va of the node "a" of the present invention is reduced compared to that of the Table 1. As a result, the positive dependency of the voltage Va on the source voltage VCC is reduced.

Second, a description is given below with respect to compensation for the variations of the temperature.

The resistance R1 of the compensating circuit 502 is a positive resistance whose resistance value is increased when carrier mobility thereof is reduced with an increase in the temperature. Accordingly, the resistance R1 has a positive temperature coefficient. Similarly, with respect to the MOS transistors, carrier mobility thereof is reduced with the increase of the temperature. However, the MOS transistors are higher than the resistance R1 in a reduction ratio of the carrier mobility to the temperature.

When the temperature is increased, an electric current I flowing through the nMOS transistor tr12 is decreased. Thereby, a voltage applied to a source n1 of the nMOS transistor tr12 is lowered. Since the voltage applied to the node IN1 of the compensating circuit 502 is somewhat raised but the raise thereof is very small, a voltage applied between the gate and the source n1 of the nMOS transistor tr12 is raised so as to compensate the electric current I.

However, since the pMOS transistor tr11 is not compensated with respect to the temperature, a channel resistance is increased when the carrier mobility thereof is reduced with the increase of the temperature and the voltage applied to the note IN2 is lowered.

When the voltage applied to the node IN2 is lowered, a voltage applied between a gate and a source of the pMOS transistor tr13 is raised and an electric current flowing therethrough is increased. However, since the carrier mobility of the PMOS transistor tr13 is reduced with the increase in the temperature, the increase in the electric current flowing therethrough is a little. As a result, the voltage applied to the node IN1 is raised a little.

The node IN1 is connected to the gate of the nMOS transistor tr9 of the compensating circuit 503. The node IN2 is connected to the gate of the nMOS transistor trio of the compensating circuit 503. When the voltage applied to the node IN2 is lowered with the increase in the temperature, the voltage applied to the node "Clamp" is raised. Thus, the node "Clamp" is kept having the positive dependency on the temperature.

Similar to the compensation for the positive dependency on the source voltage with respect to the voltage Va, the voltage applied to the node bb4 is raised with the increase in the temperature, the node bb3 is compensated for its negative dependency on the temperature. As a result, the voltage Va applied to the node "a" is thus compensated for its negative dependency on the temperature.

Table 4 shows the dependency of the voltage raising circuit of the present invention on the temperature.

TABLE 4

| Temperature (° C.) | −55 | 25 | 140 |
|---|---|---|---|
| Voltage of Node "a" Va (V) | 4.44 | 4.46 | 4.36 |
| Voltage of node bb3 (V) | 2.44 | 2.48 | 2.33 |
| Voltage of node "Clamp" (V) | 0.461 | 0.900 | 0.964 |

Referring back to Table 2, in the conventional voltage raising circuit of FIG. 3, when the temperature is raised from −55° C. to 140° C., the voltage Va applied to the node "a" is lowered by 0.17 V from 4.65 V to 4.48 V. By contrast, in the voltage raising circuit of the present invention, as can be understood from the Table 4, when the temperature is increased from −55° C. to 140° C., the voltage Va is lowered by 0.08 V from 4.44 V to 4.36 V. Accordingly, the drop of the voltage Va is reduced compared to that in the Table 2. As a result, the negative dependency of the voltage Va on the temperature is reduced.

The above description is provided in order to enable any person skilled in the art to make and use the invention and sets forth the best mode contemplated by the inventor for carrying out their invention.

Although the present invention has been described in terms of various embodiments, it is not intended that the invention be limited to these embodiments. Modification within the spirit of the invention will be apparent to those skilled in the art.

The present application is based on Japanese priority application No. 11-205290 filed on Jul. 19, 1999, the entire contents of which are hereby incorporated by reference.

What is claimed is:

1. A voltage raising circuit of a semiconductor memory, said voltage raising circuit comprising:
    a clamp circuit including a first MOS transistor whose gate is connected to a compensating circuit;

a second MOS transistor having a drain coupled with a source voltage, a gate controlled by said first MOS transistor and coupled with the drain via a capacitance, and a source coupled to a ground level, a boosted voltage being generated via said capacitance;

a capacitor outputting a raised voltage to the semiconductor memory; and the compensating circuit having:
  a negative dependency on said source voltage for controlling a first variation of said raised voltage, said first variation being caused by a variation of said source voltage; and
  a positive dependency on temperature for controlling a second variation of said raised voltage, said second variation being caused by a variation of said temperature,
    wherein the compensation circuit stabilizes a potential of the gate of said first MOS transistor of the clamp circuit by controlling said first variation and said second variation of said raised voltage against the source voltage variation and the temperature variation.

2. The voltage raising circuit as claimed in claim 1, wherein said compensating circuit includes:
  a voltage source which has a first output for outputting a constant voltage serving to compensate said variations of said source voltage and said temperature, and a second output for outputting a voltage to be raised with a raise of said source voltage and to be lowered with a raise of said temperature; and
  a control circuit which receives the voltages outputted by said first and second outputs so as to output a lowered voltage of said source voltage in a case where the voltage outputted by said second output is raised or a raised voltage of said source voltage in a case where the voltage outputted by said second output is lowered with the raise of said temperature.

3. The voltage raising circuit as claimed in claim 2, wherein said control circuit is connected between a power source and the ground and includes two nMOS transistors whose threshold values are smaller than those of nMOS transistors of said voltage source, one of said two nMOS transistors being connected to said power source and having a gate connected to said first output of said voltage source, the other of said two nMOS transistors being connected to the ground and having a gate connected to said second output of said voltage source.

4. A voltage raising circuit of a semiconductor memory, said voltage raising circuit comprising:

a clamp circuit including a first MOS transistor whose gate is connected to a compensating circuit;

a second MOS transistor having a drain coupled with a source voltage, a gate controlled by said first MOS transistor and coupled with the drain via a capacitance, and a source coupled to a ground level, a boosted voltage being generated via said capacitance;

a capacitor outputting a raised voltage to the semiconductor memory; and the compensating circuit having:
  a negative dependency on said source voltage for controlling a first variation of said raised voltage, said first variation being caused by a variation of said source voltage;
  a positive dependency on temperature for controlling a second variation of said raised voltage, said second variation being caused by a variation of said temperature;
  a voltage source which has a first output for outputting a constant voltage serving to compensate said variations of said source voltage and said temperature, and a second output for outputting a voltage to be raised with a raise of said source voltage and to be lowered with a raise of said temperature; and
  a control circuit which receives the voltages outputted by said first and second outputs so as to output a lowered voltage of said source voltage in a case where the voltage outputted by said second output is raised or a raised voltage of said source voltage in a case where the voltage outputted by said second output is lowered with the raise of said temperature;
    wherein said control circuit is connected between a power source and the ground level and includes two nMOS transistors whose threshold values are smaller than those of nMOS transistors of said voltage source, one of said two nMOS transistors being connected to said power source and having a gate connected to said first output of said voltage source, the other of said two nMOS transistors being connected to the ground level and having a gate connected to said second output of said voltage source,
    wherein the compensation circuit stabilizes a potential of the gate of said first MOS transistor of the clamp circuit by controlling said first variation and said second variation of said raised voltage against the source voltage variation and the temperature variation.

* * * * *